(12) United States Patent
Bell et al.

(10) Patent No.: US 9,338,907 B2
(45) Date of Patent: May 10, 2016

(54) THERMALLY MANAGED ENCLOSURE

(71) Applicant: Hil Tech LLC, Conroe, TX (US)

(72) Inventors: Kevin William Bell, Conroe, TX (US); James Dwight Andrews, Jr., Conroe, TX (US); Christipher Shannan Barnes, Conroe, TX (US)

(73) Assignee: HIL TECH LLC, Conroe, TX (US)

( * ) Notice: Subject to any disclaimer, the term of this patent is extended or adjusted under 35 U.S.C. 154(b) by 0 days.

(21) Appl. No.: 14/494,866

(22) Filed: Sep. 24, 2014

(65) Prior Publication Data

US 2016/0088753 A1    Mar. 24, 2016

(51) Int. Cl.
*H05K 7/20*    (2006.01)
*H05K 5/04*    (2006.01)
*G06F 1/20*    (2006.01)

(52) U.S. Cl.
CPC .............. *H05K 5/04* (2013.01); *H05K 7/20136* (2013.01); *H05K 7/20209* (2013.01); *H05K 7/20418* (2013.01)

(58) Field of Classification Search
CPC ............ G06F 1/20; H05K 7/20; H05K 7/209; H05K 7/20418; H05K 7/20404; F28F 7/00; H02B 1/28; F25D 17/04; H02K 5/136; H02K 11/0073
USPC ........... 361/679.601, 679.02, 679.46–679.53, 361/688, 689–697; 165/80.2, 80.3, 104.33, 165/121–127, 185; 174/15.1, 16.3, 50, 174/50.5, 50.52, 50.54, 520; 312/223.2, 312/223.3; 310/88, 89, 68 R, 71, 43; 62/3.7, 62/259.2
See application file for complete search history.

(56) References Cited

U.S. PATENT DOCUMENTS

| 4,214,291 | A * | 7/1980 | Koshman et al. ............. 361/608 |
| 4,520,425 | A * | 5/1985 | Ito ................................. 361/697 |
| 4,620,263 | A * | 10/1986 | Ito ................................. 361/690 |
| 4,872,102 | A * | 10/1989 | Getter ........................... 363/141 |
| 4,908,734 | A * | 3/1990 | Fujioka ......................... 361/703 |
| 5,065,278 | A * | 11/1991 | Schultz ......................... 361/688 |
| 6,065,530 | A * | 5/2000 | Austin et al. ................. 165/80.3 |
| 6,778,388 | B1 * | 8/2004 | Minelli ......................... 361/690 |
| 6,900,565 | B2 * | 5/2005 | Preston .......................... 310/88 |
| 7,418,995 | B2 * | 9/2008 | Howard et al. ............... 165/80.3 |
| 7,633,757 | B2 * | 12/2009 | Gustine et al. ................ 361/714 |
| 7,863,528 | B2 * | 1/2011 | Poidl ............................. 174/548 |
| 8,512,430 | B2 * | 8/2013 | Manahan et al. ............... 55/482 |
| 2007/0285889 | A1 * | 12/2007 | Watson et al. ................ 361/695 |
| 2009/0310301 | A1 * | 12/2009 | Nelson et al. ................. 361/695 |
| 2010/0170714 | A1 * | 7/2010 | Poidl ............................ 174/547 |
| 2010/0284150 | A1 * | 11/2010 | Manahan et al. ............. 361/695 |
| 2012/0161596 | A1 * | 6/2012 | Manahan et al. ............. 312/236 |
| 2012/0325429 | A1 * | 12/2012 | Manahan et al. ............... 165/47 |
| 2013/0137358 | A1 * | 5/2013 | Manahan et al. ............. 454/184 |

FOREIGN PATENT DOCUMENTS

| CN | 201888034 U * | 6/2011 | .............. H05K 5/00 |
| CN | 201986301 U * | 9/2011 | .............. H05K 5/00 |

* cited by examiner

*Primary Examiner* — Michail V Datskovskiy
(74) *Attorney, Agent, or Firm* — Basil M. Angelo

(57) ABSTRACT

An enclosure includes an explosion resistant housing having a back wall, a top, a first side, a second side, and a door. The enclosure further including a transistor disposed on the back wall of the explosion resistant housing. The enclosure also includes a passive heat exchanger disposed on the outside of the back wall of the explosion resistant housing. Also, a method of thermal management within an enclosure includes transferring heat from a transistor within an explosion resistant housing, wherein the heat is transferred from the transistor to a back wall of the explosion resisting housing. The method further includes passively removing the heat from the explosion resistant housing.

16 Claims, 10 Drawing Sheets

THERMALLY MANAGED ENCLOSURE

BACKGROUND OF THE INVENTION

In industrial applications, enclosures are commonly used to house and protect electrical and electronic components and systems are commonly used in industrial applications, such as oilfield, manufacturing, and pharmaceutical applications, among others. The enclosures may hold various components and systems including, for example, control components, signaling components, recording components, communication components, and the like. In conventional applications, the environment in which the enclosure is disposed have low levels of potentially explosive liquids or gases and the risk of explosion is very low. However, in certain environments, liquids and gases may be present that could result in an explosion if exposed to an ignition source.

Enclosures that are used in potentially explosive environments are commonly referred to as explosion proof, explosion resistant, or explosion protective housings. Explosion proof housings are typically manufactured from steel and the electrical and/or electronic components are sealed within the steel housing. Because the components are sealed within the housing, it is more difficult for flammable liquids and gases to enter into the housing, and thus, the flammable liquids and gases are less likely to come into contact with an ignition source, i.e., the electric and/or electronic.

However, in certain circumstances, flammable liquids and gases may enter into conventional explosion proof housings. Because the explosion proof housings may be located in environments with temperature and pressure variations, over time, the liquids and gases may be pulled into the housing. If the concentration of flammable liquids and gases is high enough, the electrical or electronic components may serve as an ignition source. If the flammable liquids and gases are ignited, the explosion proof housing is designed to prevent the explosion from escaping the housing. If the explosion was to escape the housing in an environment with flammable substances, the entire work area may be damaged if additional flammable substances are ignited.

While explosion proof housings are generally effective in controlling an explosion event at a work area, the design of such explosion proof housings often result in damage to the electric and/or electronic components held within. Because conventional explosion proof housings are designed to prevent liquids and gases from entering the enclosure, they also hold gases within the enclosure. As the electrical and electronic components are used in normal operation, heat is generated within the enclosure, and because the heated gases are not regularly removed from the enclosure, over time, the temperature in the enclosure increases to a level that may result in damage to the electric and electronic components. Damage to the electric and electronic components may ultimately result in failure of one or more pieces of equipment at a work area, thereby resulting in downtime and loss of production at the work area.

BRIEF SUMMARY OF THE INVENTION

According to one aspect of one or more embodiments of the present invention, an enclosure includes an explosion resistant housing having a back wall, a top, a first side, a second side, and a door. The enclosure further including a transistor disposed on the back wall of the explosion resistant housing. The enclosure also includes a passive heat exchanger disposed on the outside of the back wall of the explosion resistant housing.

According to another aspect of one or more embodiments of the present invention, a method of thermal management within an enclosure includes transferring heat from a transistor within an explosion resistant housing, wherein the heat is transferred from the transistor to a back wall of the explosion resisting housing. The method further includes passively removing the heat from the explosion resistant housing.

According to another aspect of one or more embodiments of the present invention, an explosion resistant enclosure includes an explosion resistant housing having a back wall, a top, a first side, a second side, and a door. The enclosure also includes a variable frequency drive disposed in the explosion resistant housing. The variable frequency drive includes at least an insulated-gate bipolar transistor and a rectifier. At least one of the insulated-gate bipolar transistor and the rectifier is disposed on the back wall of the explosion resistant housing. The enclosure also includes a passive heat exchanger disposed on the outside of the back wall of the explosion resistant housing.

Other aspects of the present invention will be apparent from the following description and claims.

DETAILED DESCRIPTION OF THE INVENTION

Figure 1:
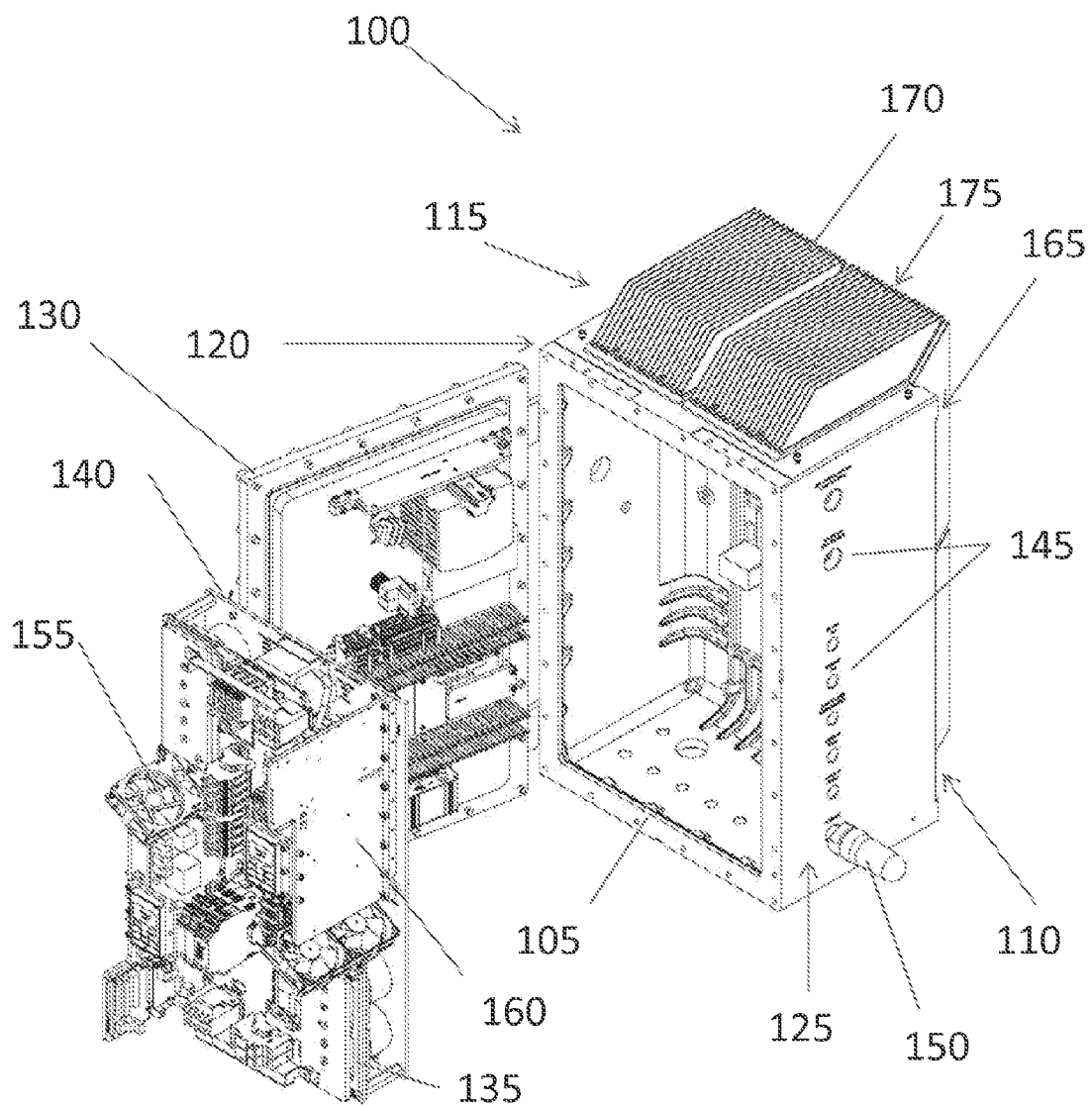
FIG. 1 shows a blow-out perspective view of an explosion resistant enclosure according to embodiments of the present disclosure.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

As indicated above, enclosures designed to hold circuit components are often used in industrial applications, such as oilfield, manufacturing, and pharmaceutical applications, among others. The enclosures may hold various types of electronics, such as control components, signaling components, recording components, communication components, and the like. Enclosures such as these often have to be used in environments that include flammable liquids and gases, and as such, must be designed to be explosion resistant, otherwise referred to as explosion proof. Explosion resistant enclosures, also referred to explosion proof enclosures are typically capable of withstanding an explosion of a gas or vapor that may occur within the enclosure. Such enclosures are also typically capable of preventing the ignition of a gas or vapor surrounding the enclosure by sparks, flashes, or explosion of the gas or vapor within the enclosure. The enclosures are also designed to operate at such an external temperature that ia surrounding flammable atmosphere will not be ignited by the outside of the enclosure.

Explosion resistant enclosures, such as those referred to herein, are designed to prevent an ignition source located within the enclosure from interacting with a flammable substance located outside the enclosure. Said another way, if ignition of a flammable substance within the enclosure was to occur, thereby causing a flare up or explosion within the enclosure, the explosion would not escape the enclosure, thereby preventing flammable substances located outside the enclosure from igniting.

One example of an explosion resistant enclosure includes enclosures that are used at oilfield work sites and wells. In the field, explosion resistant enclosures, such as those described herein, may be deployed at a work site or well in order to control one or more pieces of equipment at the work area. Examples of types of equipment that may be controlled through circuit components in such an explosion resistant enclosure include variable frequency drives, pumps, centrifuges, shale shakers, hydrocarbon separators, and/or other pieces of motorized equipment. At a well site, flammable hydrocarbon-based liquids and gases may be present in the environment at levels that could be ignited. In order to prevent potential ignition of such flammable substances, the electronics are held within explosion resistant enclosures such that if a flammable substance is ignited within the explosion resistant enclosure, the explosion does not escape the enclosure, thereby preventing damage to the well work area.

Because of the design of explosion resistant enclosures, during normal operation of circuit components located there within, a significant amount of heat may be generated. Because explosion resistant enclosures are sealed, heat may build up within the enclosures to a level that may damage the circuit components. Embodiments of the present disclosure described below include systems and methods for preventing heat from building up with such enclosures to a level that may damage the circuit components. Such systems and methods use both passive and active cooling both inside and outside such enclosures. Additionally, the placement of circuit components within enclosures, as well as the materials portions of the enclosure are manufactured allow for increased thermal management.

Examples of various types of explosion resistant enclosures are described in detail below. Those of ordinary skill in the art will appreciate that while the below described explosion resistant enclosures include specific components, in alternative embodiments, explosion resistant enclosure may include additional various components and still be within the scope of the present disclosure.

Referring initially to FIG. 1, a blow-out perspective view of an explosion resistant enclosure according to embodiments of the present disclosure is shown. In this embodiment, enclosure 100 includes an explosion resistant housing 105. The explosion resistant housing 105 has a back wall 110, a top section 115, a first side 120, a second side 125, and a door 130. As illustrated, explosion resistant housing 105 is generally rectangular in geometry, but those of ordinary skill in the art will appreciate that in alternate embodiments, explosion resistant housing 105 may include other geometries such as, for example, triangular, circular, hexagonal, etc. that may vary based on an application or design.

Explosion resistant housing 105 includes various circuit components 135, which may include, for example, various electric and/or circuit components 135 for operating different types of motorized equipment. Explosion resistant housing 105 may further include any type of circuit components 135 required to operate equipment that may be located in a hazardous environment. In this embodiment, the circuit components 135 may include variable frequency drive components, such as control panels, transistors, rectifiers, communication devices, fans, etc., which will be described in greater detail below.

Circuit components 135 may be located directly or indirectly on the explosion resistant housing 105, such as on back wall 110, top section 115, first side 120, second side 125 or on the door 130. Additionally, circuit components 135 may be located on one or more plates 140 that may be disposed within explosion resistant housing 105. In still other embodiments, circuit components 135 may be disposed on printed circuit boards (not independently illustrated), which may then be secured to explosion resistant housing 105 and/or plate 140. While only a single plate 140 is shown in this embodiment, those of ordinary skill in the art will appreciate that in other embodiments, two, three, four, or more plates may be used to hold circuit components 135. In still other embodiments, all of the circuit components 135 may be on a single plate 140, or the circuit components 135 may be disposed directly on explosion resistant housing 105.

Explosion resistant housing 105 also includes various ports 145 located on first side 120 and second side 125. The ports 145 may be used to run cables 150 including, for example, control, communication, power, antenna, and the like, from an external source. Such cables 150 may be used to provide power or otherwise provide control of the circuit components 135, or may provide for control of equipment located outside explosion resistant housing 105. In order to maintain explosion resistance, ports 145 may be sealed to prevent or substantially decrease the exposure of circuit components 135 to potentially flammable substances located outside of explosion resistant housing 105. While not explicitly shown, cables 150 may be secured to ports 145 through mechanical attachment, such as with screws, rivets, snap-fits, etc. In alternative embodiments, cables 150 may be secured to ports 145 though chemical bonding, welding, brazing, or other attachment means known to those of ordinary skill in the art. Additionally, seals, such as O-rings and gaskets, may be used to further prevent flammable substances from entering explosion resistant housing 105. In certain embodiments, a cable gland may be used to connect cables 150 from outside sources to components within the explosion resistant housing 105. Cable glands may be constructed of metallic or non-metallic materials, such as plastic, brass, aluminum, stainless steel, etc. While various types of cable glands may be used in embodiments of the present disclosure, those of ordinary skill in the art will appreciate that cable glands commonly have a central housing, having external threads, seals, locknuts, pressure domes, and other features that allow cables 150 to be connected to components within explosion resistant housing 105. In certain embodiments, chemical bonds may be used to seal components of the cable glands or to seal the cable gland to the explosion resistant housing 105.

In addition to circuit components 105 for controlling equipment, explosion resistant housing 105 also includes thermal management equipment, such as air circulation device 155. Examples of air circulation devices include fans that move air within explosion resistant housing 105. In this embodiment, four air circulation devices 155 are disposed on plate 140. Air circulation devices 155 may thereby move air within explosion resistant housing 105 away from circuit components 105 that are generating heat to prevent the circuit components 135 from being damaged. In certain embodiments, air circulation devices 155 may be used to provide cooler air to circuit components 135. While FIG. 1 is shown having four air circulation devices 155, those of ordinary skill in the art will appreciate that in other embodiments, there may not be an air circulation device 155, or may be more or less than four air circulation devices 155. For example, in alternative embodiments, one, two, three, five, six, or more air circulation devices 155 may be disposed within explosion resistant housing 105. In addition to air circulation devices 155 being disposed on plate 140, air circulation devices may be attached directly or indirectly to explosion resistant housing 105, such as on the back wall 110, top section 115, first side 120, second side 125 or on the door 130. In still other embodiments, air circulation devices 155 may be disposed directly or indirectly to specific circuit components 135.

To further allow for thermal management within explosion resistant housing 105, enclosure 100 may include one or more secondary plates 160, in addition to plate 140. Secondary plates 160 may be used to draw heat to the exterior of the explosion resistant housing 105 by contacting or being proximate to specific heat generating circuit components 135. In certain embodiments, circuit components 135 may be disposed directly or indirectly on secondary plates 160, thereby pulling heat away from circuit components. In other embodiments, secondary plates 160 may be used to shield certain circuit components 135 from other circuit components 135 that may be generating more heat. Depending on the design and thermal management requirements, more than one secondary plate 140 may be used. For example, in certain embodiments, two, three, or more secondary plates 160 may be used, which in other embodiments, no secondary plates 140 may be required.

Both plate 140 and secondary plates 160 may be manufactured from materials that allow for improved thermal regulation. For example, metal and metal alloys including aluminum may be used to transfer heat away from circuit components 135 toward the back wall 110, top section 115, first side 120, second side 125 or the door 130 of explosion resistant housing 105. The type of aluminum containing metal and metal alloy may vary depending on the thermal management properties that are required. For example, in certain embodiments, metal alloys having 10-20 percent aluminum may be used, while in other embodiments, metal alloys having 20-50 percent aluminum may be used. In still other embodiments, metal alloys having between 50 and 75 percent aluminum, 75 and 95 or substantially 100 percent aluminum may be used.

The percent aluminum used in the alloy may be used to achieve a desired thermal conductivity. Thermal conductivity refers to the quantity of heat that is transmitted through a unit thickness in a direction normal to a surface of unit area due to a unit temperature gradient under steady state conditions. Thus, at 68° F. pure aluminum has a thermal conductivity of approximately 118 W/mK, at 200° F. pure aluminum has a thermal conductivity of approximately 124 W/mK, and at 400° F. pure aluminum has a thermal conductivity of approximately 144 W/mK. In certain embodiments, it may be beneficial for the aluminum alloy used to have a thermal conductivity of greater than 26 W/mK at 68° F. In other embodiments, the thermal conductivity of the alloy used may be between 27 W/mK and 50 W/mK at 68° F., between 50 W/mK and 75 W/mK at 68° F., between 75 W/mK and 100 W/mK at 68° F., and between 100 W/mK and 118 W/mK at 68° F. In still other embodiments, the thermal conductivity of the alloy used may be between 27 W/mK and 118 W/mK at 68° F. Those of ordinary skill in the art will appreciate that while aluminum alloy has been described as a metal that is used according to embodiments described herein, in other embodiments, other metals and metal alloys may be used. In such embodiments, the metals and metal alloys used may have a thermal conductivity of greater than 26 W/mK at 68° F. Accordingly, the thermal conductivity of the metal and/or metal alloys used may be any value greater than 26 W/mK at 68° F., such as between 27 W/mK and 118 W/mK at 68° F., or greater than 118 W/mK at 68° F.

In addition to plate 140 and secondary plate(s) 160, explosive resistant housing 105 may also be constructed of aluminum or aluminum alloys. As with plate 140 and secondary plate(s) 160, it may be beneficial for the aluminum alloy used to have a thermal conductivity of greater than 26 W/mK at 68° F. In other embodiments, the thermal conductivity of the alloy used may be between 27 and 50 W/mK at 68° F., between 50 W/mK and 75 W/mK at 68° F., between 75 W/mK and 100 W/mK at 68° F., and between 100 W/mK and 118 W/mK at 68° F. In still other embodiments, the thermal conductivity of the alloy used may be between 27 W/mK and 118 W/mK at 68° F. Those of ordinary skill in the art will appreciate that while aluminum alloy has been described as a metal that is used according to embodiments described herein, in other embodiments, other metals and metal alloys may be used. In such embodiments, the metals and metal alloys used may have a thermal conductivity of greater than 26 W/mK at 68° F. Accordingly, the thermal conductivity of the metal and/or metal alloys used may be any value greater than 26 W/mK at 68° F., such as between 27 W/mK and 118 W/mK at 68° F., or greater than 118 W/mK at 68° F. In certain embodiments, an alloy of aluminum and steel may be used. In such an embodiment, the thermal conductivity of the alloy may be less than 26 W/mK at 68° F. For example, in certain embodiments, an aluminum steel alloy, or another steel alloy may have a thermal conductivity between 20 W/mK and 26 W/mK at 68° F.

Explosion resistant housing 105 may also include a heat exchanger 165 attached to the back wall 110. Heat exchanger 165 may include a plurality of fins 170, or raised edges, that passively promote heat dissipation. Heat exchanger 165 may be attached directly to back wall 110, or in other embodiments, may be mounted on a separate plate (not shown) to further promote heat dissipation. The fins 170 may be of any geometry so as to maximize the surface area contact with the air around it. As such, in certain embodiments, fins 170 may be between 0.5 and 1.0 inches, between 1.0 and 2.0 inches, between 2.0 and 3.0 inches, or greater than 3.0 inches. In still other embodiments, fins 170 may be less than 0.5 inches, such as between 0.1 and 0.5 inches. Heat exchanger 165 may be a single piece, or may include multiple pieces that are individually attached to explosion resistant housing 105.

In other embodiments, in addition to heat exchanger 165, a second heat exchanger 175 may be attached to the top of explosion proof housing 105. Second heat exchanger 175 may be attached directly to the top section 115, or in other embodiments, may be mounted on a separate plate (not shown) to further promote heat dissipation. The fins 170 of second heat exchanger 175 may be of any geometry so as to maximize the surface area contact with the air around it. As such, in certain embodiments, fins 170 may be between 0.5 and 1.0 inches, between 1.0 and 2.0 inches, between 2.0 and 3.0 inches, or greater than 3.0 inches. In still other embodiments, fins 170 may be less than 0.5 inches, such as between 0.1 and 0.5 inches. Second heat exchanger 175 may be a single piece, or may include multiple pieces that are individually attached to explosion resistant housing 105. In certain embodiments, heat exchanger 165 and second heat exchanger 175 may be a single piece that is mounted on explosion resistant housing 105 at the same time. Second heat exchanger 175 may also be disposed on side walls 120 and 125 or at any other location on explosion resistant housing that may promote the dissipation of heat.

Figure 2:
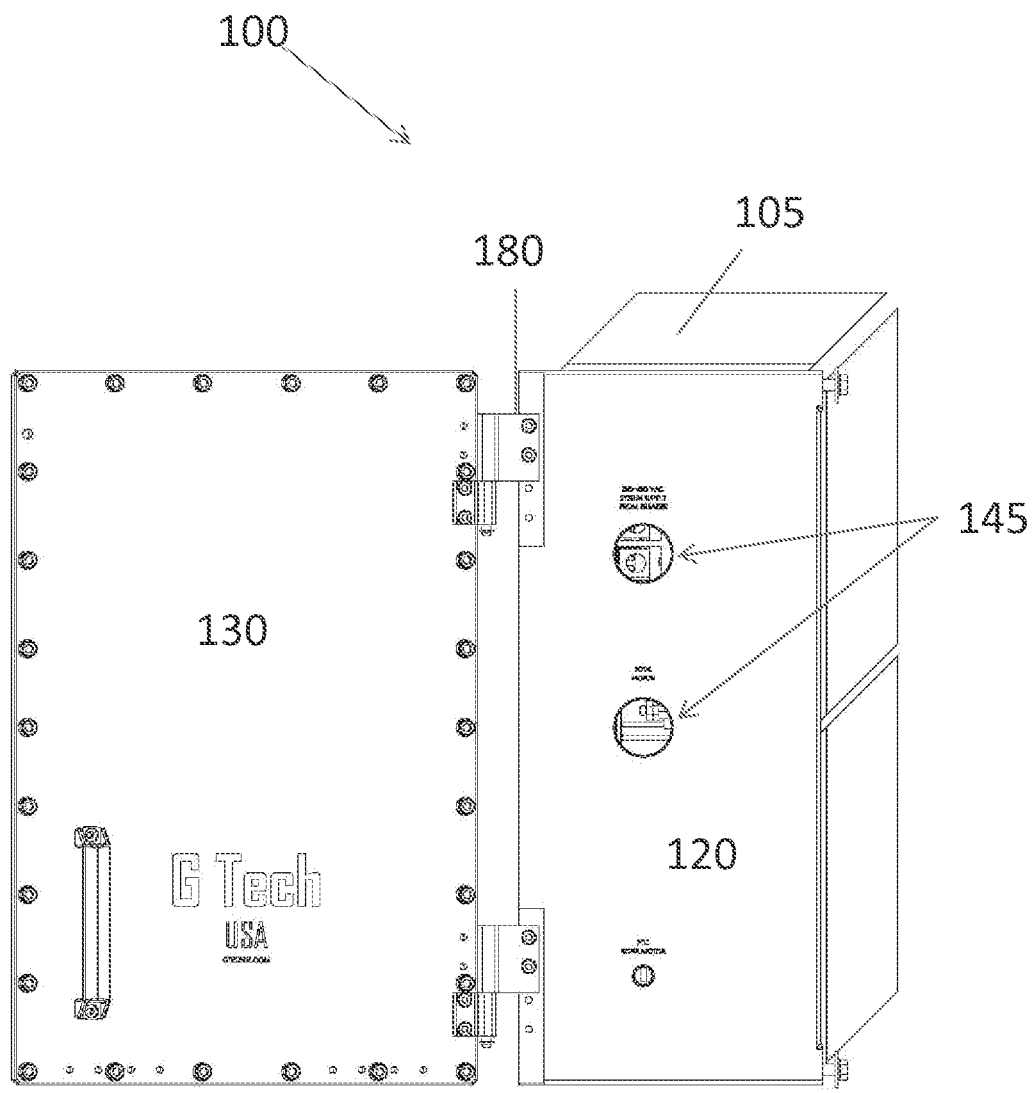
FIG. 2 shows a side view of an explosion resistant enclosure according to embodiments of the present disclosure.

Referring to FIG. 2, a side view of an explosion resistant enclosure according to embodiments of the present disclosure is shown. In this embodiment, explosion resistant enclosure 100 is shown with the door 130 open. Additionally, explosion resistant housing has multiple ports 145 located on side wall 120. Door 130 is attached to explosion resistant housing 105 with a plurality of hinges 180, thereby allowing the door 130 to be opened as needed. Door 130 may be closed, to seal explosion resistant housing 105, and may be secured in place through one or more locking devices (not shown). The locking devices may be used to prevent door 130 from inadvertently opening, thereby exposing flammable substances to circuit components located within explosion resistant housing 105. In attrition to locking devices, one or more seals may be disposed around door 130, thereby further preventing flammable substances from entering explosion resistant housing.

In this embodiment, explosion resistant enclosure 100 does not include a first or second heat exchanger. Accordingly, thermal regulation inside explosion resistant enclosure 100 may be managed by the placement of circuit components within explosion resistant housing, the use of air circulation devices, the types of material used in making explosion resistant enclosure 100, and other methods described herein. Those of ordinary skill in the art will appreciate that one or more heat exchangers may be added to explosion resistant housing 105 to further promote heat dissipation.

Figure 3:
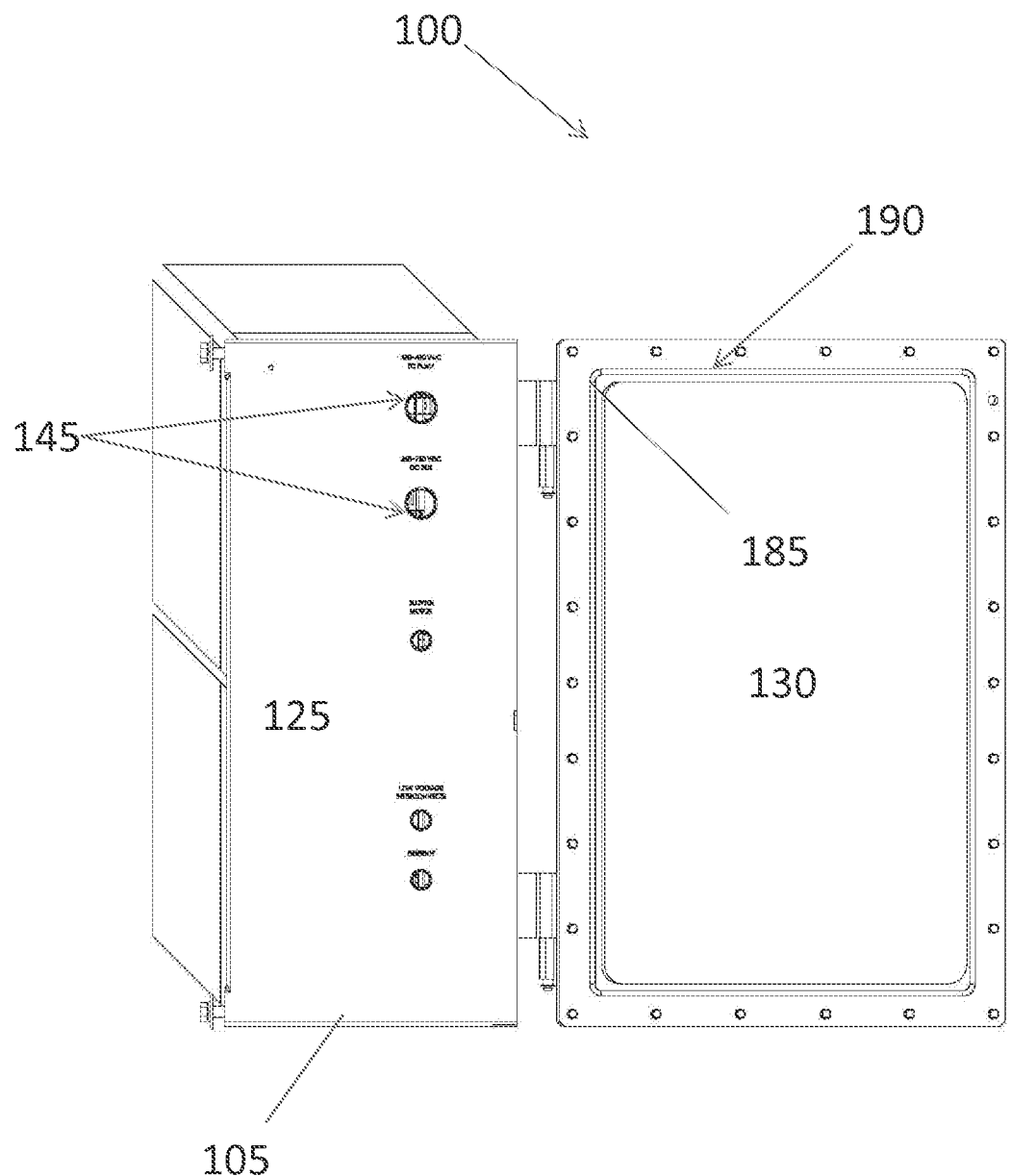
FIG. 3 shows a side view of an explosion resistant enclosure according to embodiments of the present disclosure.

Referring to FIG. 3, a side view of an explosion resistant enclosure according to embodiments of the present disclosure is shown. In this embodiment, explosion resistant enclosure 100 is shown with the door 130 open. Additionally, explosion resistant housing has multiple ports 145 located on side wall 125. Door 130 is attached to explosion resistant housing 105 with a plurality of hinges 180, thereby allowing the door 130 to be opened as needed. Door 130 may be closed, to seal explosion resistant housing 105, and may be secured in place through one or more locking devices (not shown). The locking devices may be used to prevent door 130 from inadvertently opening, thereby exposing flammable substances to circuit components located within explosion resistant housing 105. In addition to locking devices, one or more seals 185 may be disposed around door 130, thereby further preventing flammable substances from entering explosion resistant housing. Seals 185 may be formed from plastics, rubber, or composites and may be of a geometry to fit around an edge 190 of door 130. Those of ordinary skill in the art will appreciate that seal 185 may be located on various locations around door 130 or explosion resistant housing 105. Thus, in one embodiment, seal 185 may be disposed proximate an edge 190 of door 130, while in other embodiments, seal 185 may be disposed around an edge (not shown) of explosion resistant housing 105.

In this embodiment, explosion resistant enclosure 100 does not include a first or second heat exchanger. Accordingly, thermal regulation inside explosion resistant enclosure 100 may be managed by the placement of circuit components 135 within explosion resistant housing, the use of air circulation devices, the types of material used in making explosion resistant enclosure 100, and other methods described herein. Those of ordinary skill in the art will appreciate that one or more heat exchangers may be added to explosion resistant housing 105 to further promote heat dissipation.

Figure 4:
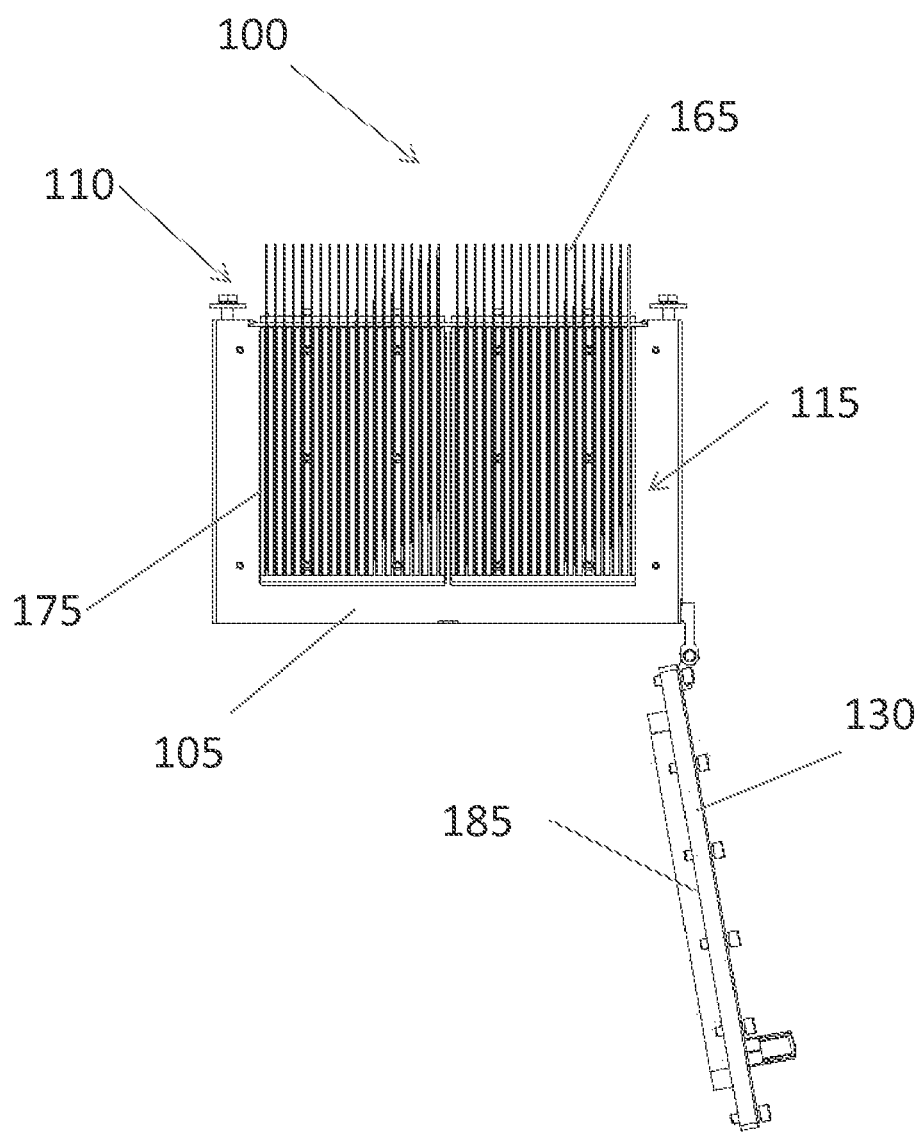
FIG. 4 shows a top view of an explosion resistant enclosure according to embodiments of the present disclosure.

Referring to FIG. 4, a top view of an explosion resistant enclosure according to embodiments of the present disclosure is shown. In this embodiment, explosion resistant enclosure 100 includes an explosion resistant housing 105 having a door 130 in an open position. As explained in detail above, door 130 may be closed and sealed shut though a combination of locking mechanism (not shown) and/or seals 185.

In this embodiment, explosion resistant enclosure 100 is shown having a heat exchanger 165 disposed on the back wall 110 of explosion resistant housing 105. Additionally, a second heat exchanger 175 is disposed on the top 115 of explosion resistant housing 105. As illustrated, the second heat exchanger 175 covers a majority of the top 115 of explosion resistant housing 105. By increasing the coverage area of second heat exchanger 175 relative to the total area of the top 115 of explosion resistant housing, the rate of heat exchange may be increased, thereby increasing thermal dissipation from within explosion resistant housing. Depending on the requirements for thermal dissipation, the coverage area of second heat exchanger 175 may be greater than 10 percent, between 10 and 25 percent, between 25 and 50 percent, between 50 and 75 percent, between 75 and 95 percent, or greater than 95 percent.

Figure 5:
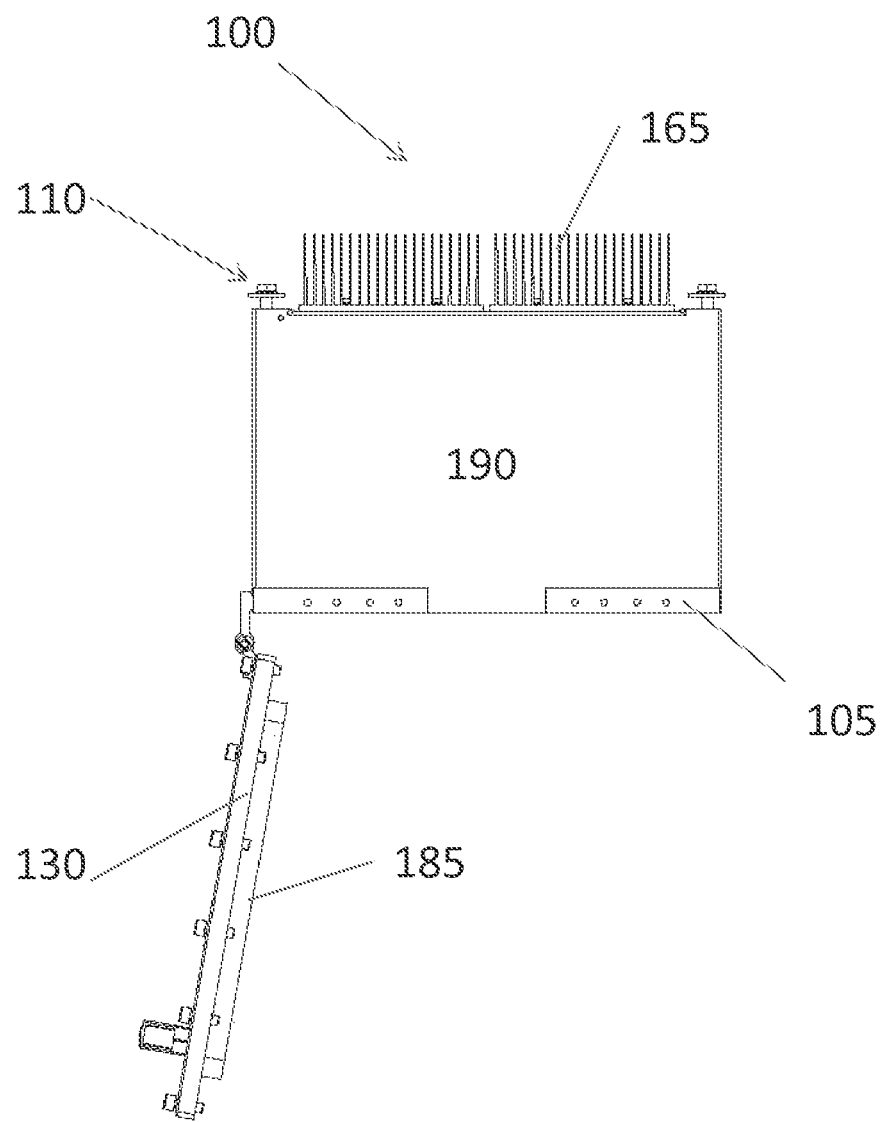
FIG. 5 shows a bottom view of an explosion resistant enclosure according to embodiments of the present disclosure.

Referring to FIG. 5, a bottom view of an explosion resistant enclosure according to embodiments of the present disclosure is shown. In this embodiment, explosion resistant enclosure 100 includes an explosion resistant housing 105 having a door 130 in an open position. As explained in detail above, door 130 may be closed and sealed shut though a combination of locking mechanism (not shown) and/or seals 185.

In this embodiment, explosion resistant enclosure 100 is shown having a heat exchanger 165 disposed on the back wall 110 of explosion resistant housing 105. While in this embodiment the bottom 190 of explosion resistant housing 105 does not include a heat exchanger 165, in other embodiments, heat exchanger 165 may wrap around and cover a portion of the bottom 190 of explosion resistant housing. In still other embodiments, a second or third heat exchanger (not shown) may be disposed totally or partially on the bottom 190 of explosion resistant housing 105.

Figure 6:
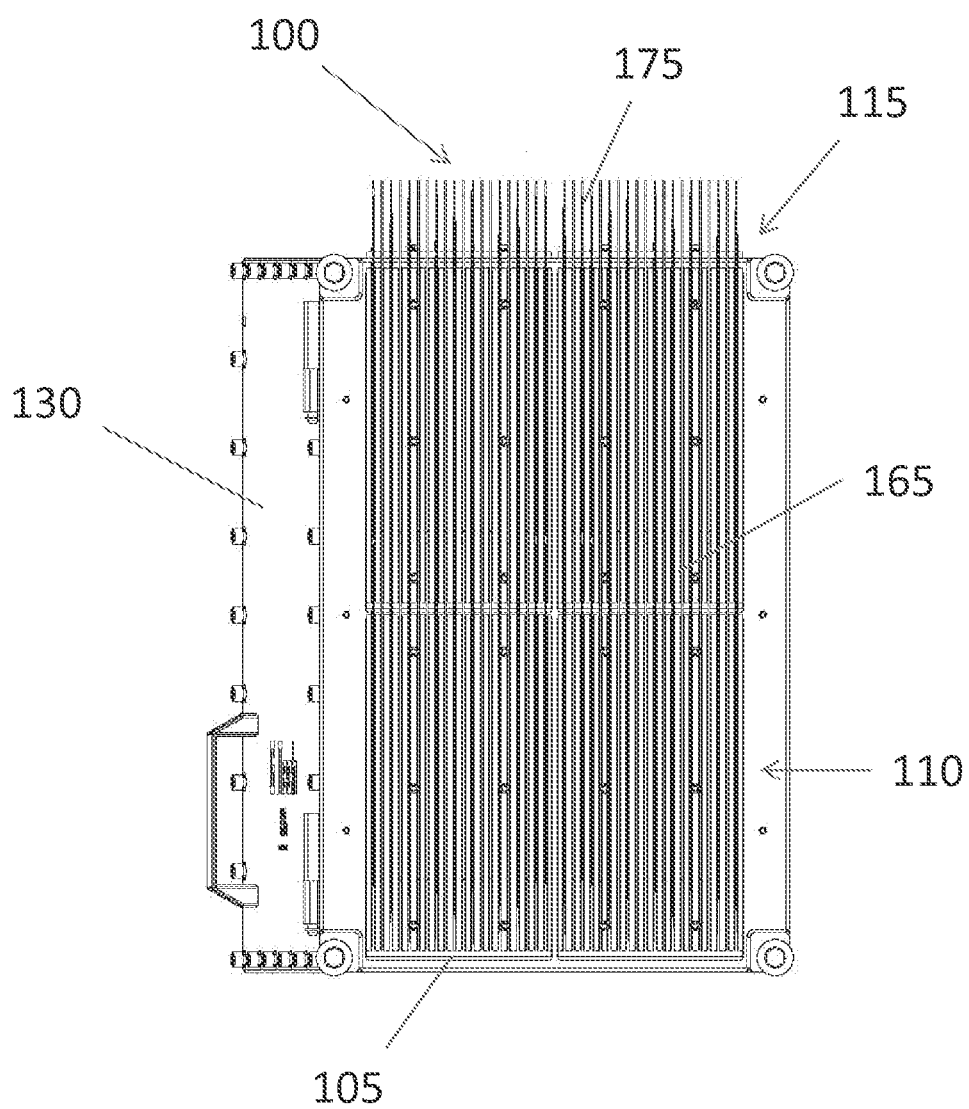
FIG. 6 shows a back view of an explosion resistant enclosure according to embodiments of the present disclosure.

Referring to FIG. 6, a back view of an explosion resistant enclosure according to embodiments of the present disclosure is shown. In this embodiment, explosion resistant enclosure includes an explosion resistant housing 105 having a door 130 in an open position. As explained in detail above, door 130 may be closed and sealed shut though a combination of locking mechanism (not shown) and/or seals (not shown).

In this embodiment, explosion resistant enclosure 100 is shown having a heat exchanger 165 disposed on the back wall 110 of explosion resistant housing 105. Additionally, a second heat exchanger 175 is disposed on the top 115 of explosion resistant housing 105. Depending on the requirements for thermal dissipation, the coverage area of heat exchanger 165 may be greater than 10 percent, between 10 and 25 percent, between 25 and 50 percent, between 50 and 75 percent, between 75 and 95 percent, or greater than 95 percent.

Figure 7:
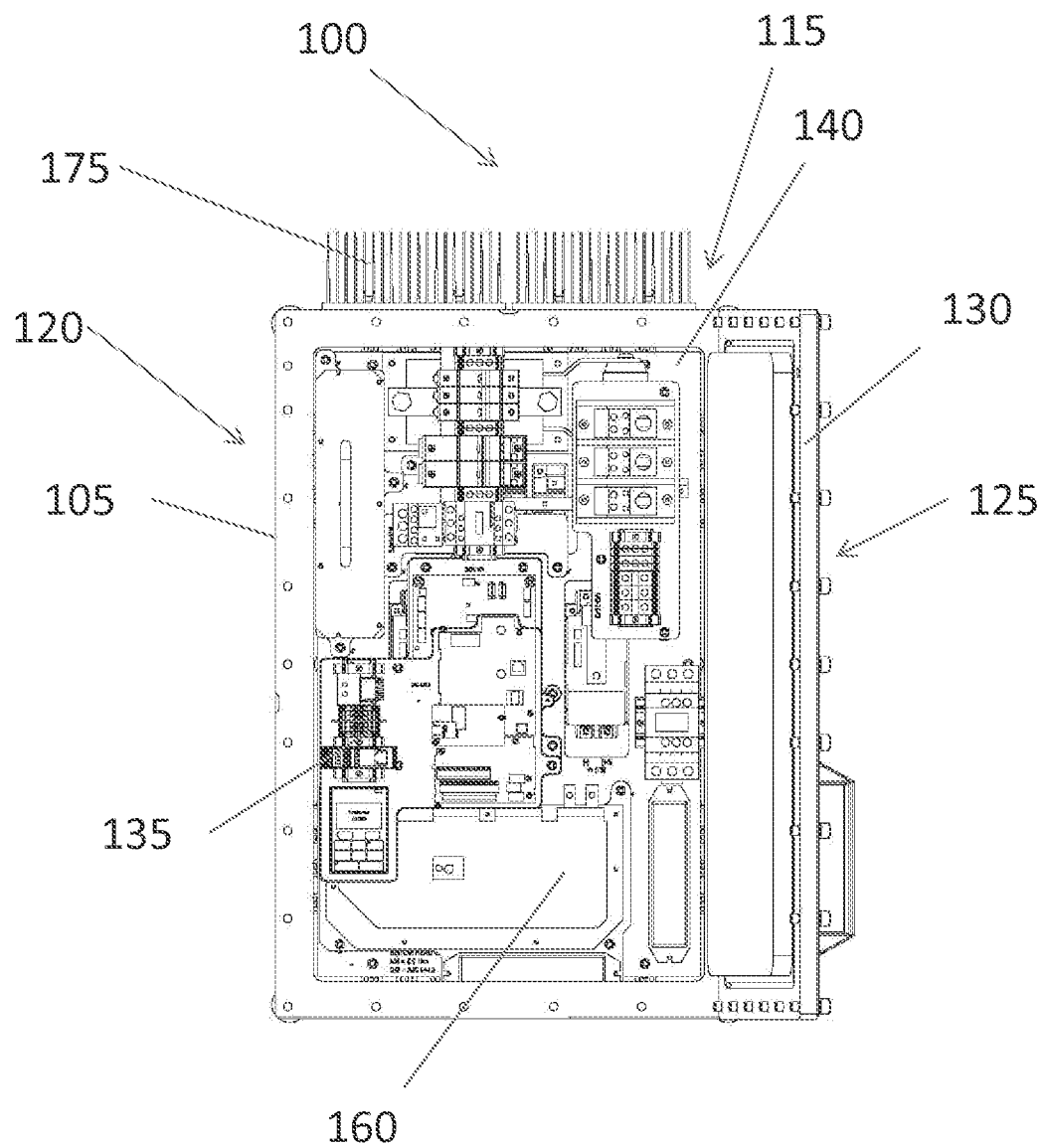
FIG. 7 shows a front view of an explosion resistant enclosure according to embodiments of the present disclosure.

Referring to FIG. 7, a front view of an explosion resistant enclosure according to embodiments of the present disclosure is shown. In this embodiment, explosion resistant enclosure 100 includes an explosion resistant housing 105 having a door 130 in an open position. As explained in detail above, door 130 may be closed and sealed shut though a combination of locking mechanism (not shown) and/or seals (not shown).

In this embodiment, explosion resistant housing 100 includes various circuit components 135 for controlling motorized equipment. Some of the circuit components 135 are mounted on a plate 140. The plate 140 holding the circuit components 135 may be installed in explosion resistant housing 105, as illustrated. Explosion resistant housing 100 also includes secondary plates 160, onto which other circuit components 135 may be installed.

Explosion resistant housing 100 further includes a heat exchanger 175 connected to the top 115 of explosion resistant housing 105. Because the circuit components 135 are located near the top 115 of explosion resistant housing 105, the heat exchanger 175 mounted on the top 115 of explosion resistant housing 105 may facilitate the dissipation of heat from within explosion resistant housing 105. Those of ordinary skill in the art will appreciate that in alternate embodiments additional heat exchangers (not shown) may be mounted on the sides 120 and 125 of explosion resistant housing 105.

Figure 8:
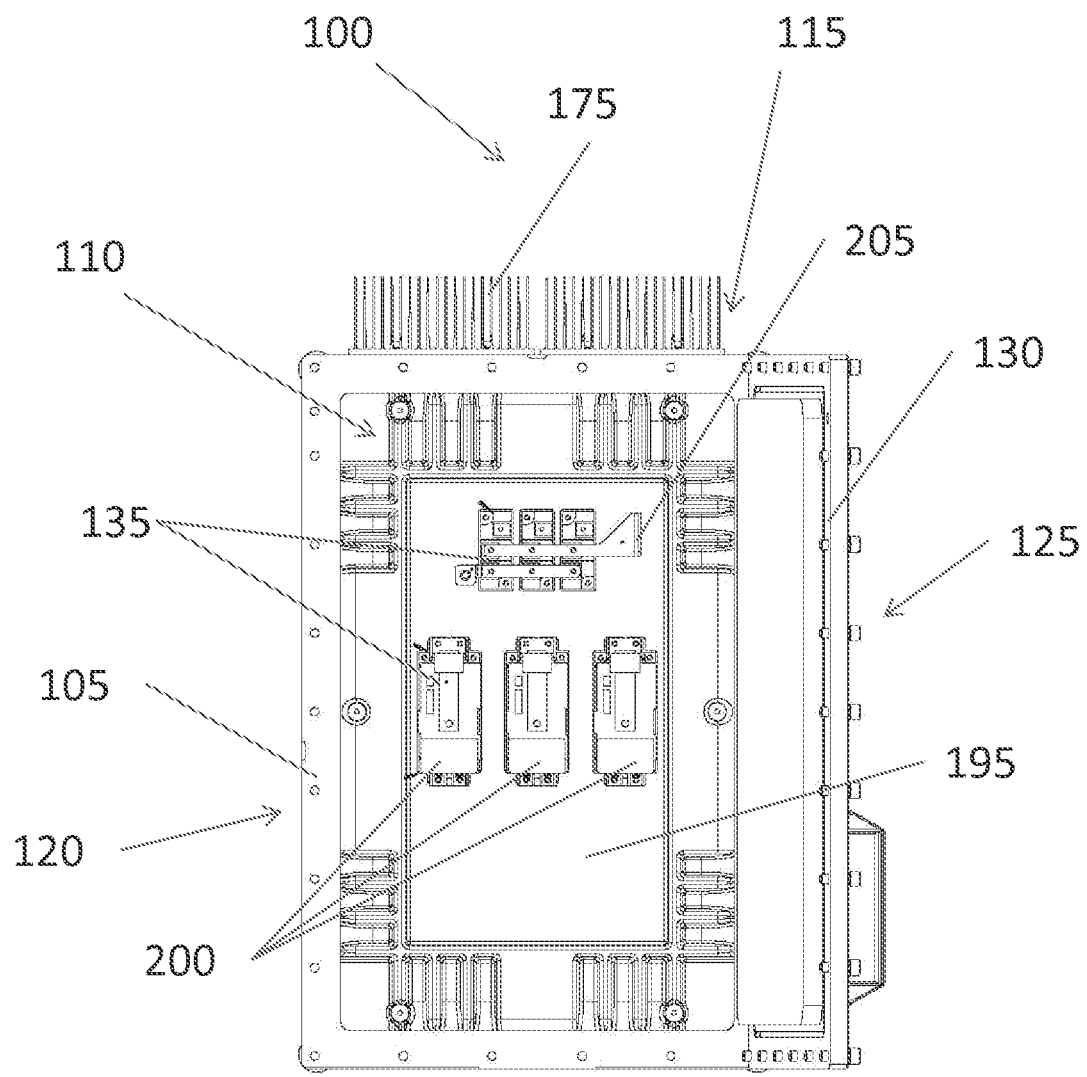
FIG. 8 shows a front view of an explosion resistant enclosure according to embodiments of the present disclosure.

Referring to FIG. 8, a front view of an explosion resistant enclosure according to embodiments of the present disclosure is shown. In this embodiment, explosion resistant enclosure 100 includes an explosion resistant housing 105 having a door 130 in an open position. As explained in detail above, door 130 may be closed and sealed shut though a combination of locking mechanism (not shown) and/or seals (not shown).

In this embodiment, certain circuit components 135 may be mounted to a plate 195 and installed proximate the back wall 110 of explosion resistant housing 105. More specifically, the circuit components 135 that generate the most heat may be installed closest to the back wall 110 of explosion resistant housing 105, thereby promoting the dissipation of heat therefrom. In this embodiment, the circuit components 135 that are mounted on the back wall 110 of explosion resistant housing 105 include various transistors 200 and rectifiers 205. In one embodiment, transistors 200 may include insulated-gate bipolar transistors 200 that may be used in variable frequency drives and adjustable speed drives. Insulated-gate bipolar transistors 200 are power semiconductor devices that are used as electronic switches. Rectifiers 205 are electrical devices that convert alternating current to direct current. Both insulated-gate bipolar transistors 200 and rectifiers 205 generate large amounts of heat during operation, and as such, removing the heat from the explosion resistant housing 105 is beneficial in preventing the components from overheating and/or causing other electrical components 135 within explosion resistant housing 105 from overheating.

In certain explosion resistant enclosures 100, insulated-gate bipolar transistors 200 and rectifiers 205 are mounted directly to back wall 110 of explosion resistant housing 105. However, in other embodiments, insulated-gate bipolar transistors 200 and rectifiers 205 may be mounted to a plate 195 that is then mounted to the explosion resistant housing 105. Plate 195 may be made from various metal and metal alloys including, for example aluminum.

Explosion resistant housing 100 further includes a heat exchanger 175 connected to the top 115 of explosion resistant housing 105. Because the circuit components 135 are located near the top 115 of explosion resistant housing 105, the heat exchanger 175 mounted on the top 115 of explosion resistant housing 105 may facilitate the dissipation of heat from within explosion resistant housing 105. Those of ordinary skill in the art will appreciate that in alternate embodiments additional heat exchangers (not shown) may be mounted on the sides 120 and 125 of explosion resistant housing 105.

As with plate 140 (FIG. 1) and secondary plate(s) 160 (FIG. 1), it may be beneficial for the aluminum alloy used to have a thermal conductivity of greater than 26 W/mK at 68° F.

In other embodiments, the thermal conductivity of the alloy used may be between 27 W/mK and 50 W/mK at 68° F., between 50 W/mK and 75 W/mK at 68° F., between 75 W/mK and 100 W/mK at 68° F., and between 100 W/mK and 118 W/mK at 68° F. In still other embodiments, the thermal conductivity of the alloy used may be between 27 W/mK and 118 W/mK at 68° F. Those of ordinary skill in the art will appreciate that while aluminum alloy has been described as a metal that is used according to embodiments described herein, in other embodiments, other metals and metal alloys may be used. In such embodiments, the metals and metal alloys used may have a thermal conductivity of greater than 26 W/mK at 68° F. Accordingly, the thermal conductivity of the metal and/or metal alloys used may be any value greater than 26 W/mK at 68° F., such as between 27 W/mK and 118 W/mK at 68° F., or greater than 118 W/mK at 68° F. In certain embodiments, an alloy of aluminum and steel may be used. In such an embodiment, the thermal conductivity of the alloy may be less than 26 W/mK at 68° F. For example, in certain embodiments, an aluminum steel alloy, or another steel alloy may have a thermal conductivity between 20 W/mK and 26 W/mK at 68° F.

In addition to insulated-gate bipolar transistors 200 and rectifiers 205, additional circuit components 135 may be mounted directly to back wall 110 of explosion resistant housing 105 or to a plate 195 that is installed in explosion resistant housing 105. Examples of other circuit components 135 include resistors, transistors, capacitors, electric switches, etc. Those of ordinary skill in view of the present disclosure will appreciate that any type of electronic component that may be included in an explosion resistant housing 105 may be mounted directly to back wall 110, side walls 120 and/or 125, or door 130 of explosion resistant housing 105 or to a plate 195 that is installed in explosion resistant housing 105.

By placing high heat generating circuit components 135 on back wall 110 of explosion resistant housing 105 or to a plate 195 that is installed in explosion resistant housing 105 the heat may be removed from the explosion resistant housing 105 more efficiently. Additionally, by placing high heat generating circuit components 135 on back wall 110 of explosion resistant housing 105 or to a plate 195 that is installed in explosion resistant housing 105, the high heat generating components are located away from other circuit components 135 that may be heat sensitive.

In other embodiments, high heat generating components may alternatively be installed on sides 120 and 125 of explosion resistant housing 105. In such an embodiment, heat exchangers may be located on sides 120 and 125 in addition to or instead of heat exchanger 175 located on top of explosion resistant housing 105, or heat exchanger 165 (FIG. 1) located on the back wall 110 of explosion resistant housing 105.

While FIG. 8 shows three to insulated-gate bipolar transistors 200 and 1 rectifier 205, those of ordinary skill in the art will appreciate that greater or fewer insulated-gate bipolar transistors 200 and rectifier 205 may be disposed on back wall 110 or on a plate 195 attached to back wall 110. Additionally, in certain embodiments, one or more of the insulated-gate bipolar transistors 200 or rectifiers 205 may not be located on back wall 110 or plate 195. For example, in certain embodiments, insulated-gate bipolar transistors 200 and rectifiers 205 may not be the highest heat generating circuit components 135 within explosion resistant housing 105. In such embodiments, the higher heat generating circuit components 135 may be mounted on back wall 110 or plate 195 attached to back wall.

Referring to FIGS. 7 and 8 together, circuit components 135 for a variable frequency drive are shown. Specifically, FIG. 8 shows three insulated-gate bipolar transistors 200 and one rectifier 205 that may be used as part of a variable frequency drive. While the embodiment depicted in FIGS. 7 and 8 show three insulated-gate bipolar transistors 200 and one rectifier 205, one of ordinary skill in the art will recognize that the number of each may vary based on an application or design. Additional variable frequency drive components are shown in FIG. 7, and identified as circuit components 135. Because of the heat generating properties of insulated-gate bipolar transistors 200 and rectifier 205 in certain applications, such as, for example, a variable frequency drive, they are physically disposed in a separate location from other circuit components 135 even though they may be part of the same circuit, subsystem, or system. Specifically, in certain embodiments, insulated-gate bipolar transistors 200 and rectifier 205 may be disposed on a plate 195 that is then secured to the back wall 110 of explosion resistant housing 105. The insulated-gate bipolar transistors 200 and rectifier 205 are in contact with the plate 195, and as they generate heat, the heat dissipates through plate 195 and then through explosion resistant housing 105 due to the increased thermal conductivity of the plate 195 and explosion resistant housing 105. In other embodiments, insulated-gate bipolar transistors 200 and rectifier 205 may be secured directly to explosion resistant housing 105. In such an embodiment, the heat generated by the insulated-gate bipolar transistors 200 and rectifier 205 will transfer to the back wall 110 of the explosion resistant housing 105. In either case, whether the integrated-gate bipolar transistor 200 and the rectifier 205 are secured to the back wall 110 or to a plate 195, the heat exchanger 165 (FIG. 1) facilitates removal of heat from the explosion resistant housing 105 by providing greater surface area for the heat to dissipate.

In addition to integrated-gate bipolar transistor 200 and rectifier 205, other circuit components 135 may be disposed within explosion resistant housing 105. As illustrated specifically in FIG. 7, a variable frequency drive may include numerous other circuit components 135. In certain embodiments, one or more other circuit components 135, that do not generate a substantial amount of heat, may be disposed on one or more printed circuit boards that are attached to or otherwise secured to explosion resistant housing 105. In other embodiments, one or more other circuit components 135 may be disposed on one or more printed circuit boards that are thermally coupled to one or more plates 140 that are attached or otherwise secured to explosion resistant housing 105 to dissipate heat. In still other embodiments, one or more other circuit components 135 may be disposed on one or more plates 140, as described above.

Figure 9:
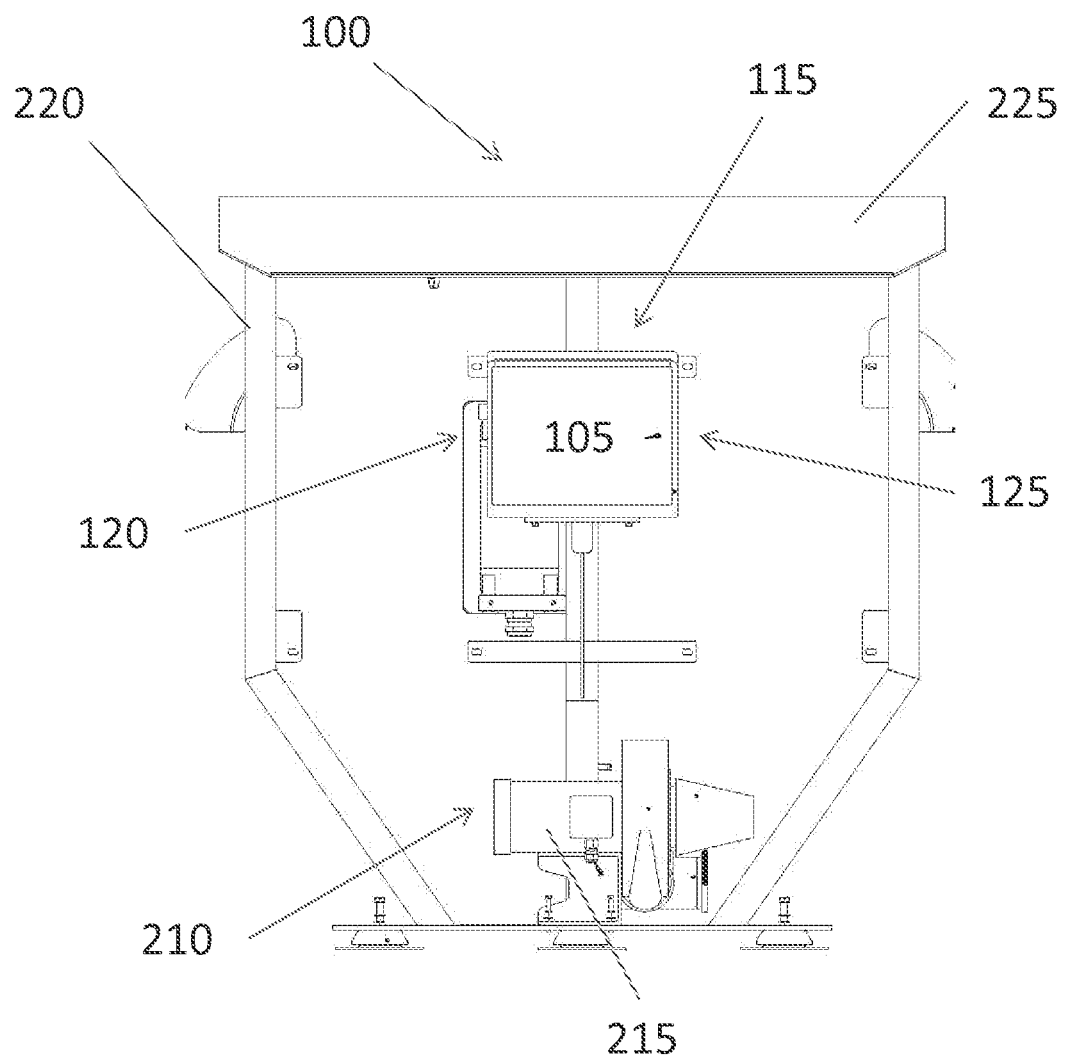
FIG. 9 shows a front view of an explosion resistant enclosure according to embodiments of the present disclosure.

Referring to FIG. 9, a front view of an explosion resistant enclosure according to embodiments of the present disclosure is shown. In this embodiment, explosion resistant housing 105 is illustrated as part of a larger explosion resistant enclosure 100 designed to further improve heat dissipation from within explosion resistant housing 105. Explosion resistant enclosure 100 includes an external air circulation device 210 located outside of explosion resistant housing 105. External air circulation device 210 may include a blower 215, that circulates air over the heat exchangers 165 and 175 (FIG. 1).

By circulating air over the heat exchangers 165 and 175 (FIG. 1), heat may be removed from the fins 170 (FIG. 1) and thus remove heat from explosion resistant housing 105 more efficiently. Those of ordinary skill in the art in view of the present disclosure will appreciate that external air circulation device 210 may direct air to various portions of explosion resistant housing 105 including the heat exchanger 165 (FIG. 1) located on back wall 110 (FIG. 1) of explosion resistant housing 105, the heat exchanger 175 (FIG. 1) located on the top 115 of explosion resistant housing 105, or from other areas of explosion resistant housing, including sides 120 and 125. In certain embodiments, the external air circulation device 210 may pass air directly over explosion resistant housing 105.

While the blower 215 is illustrated below explosion resistant housing 105, in alternate embodiments, the blower 215 may be located elsewhere within explosion resistant enclosure 100. For examples, in other embodiments the blower 215 may be located above explosion resistant housing 105, on the side of explosion resistant housing 105, or outside the structure 220 holding explosion resistant housing 105. In still other embodiments more than one external air circulation device 210 may be disposed in, on, or proximate explosion resistant enclosure 100.

In addition to external air circulation device 210, explosion resistant enclosure 100 may also include a radiant barrier 225 disposed above explosion resistant housing 105. Radiant barrier 225 may be configured to direct air over heat exchangers 165 and/or 175 (FIG. 1), over explosion resistant housing 105, or over another portion of explosion resistant enclosure 100. Radiant barrier 225 may be made from various metals, metal alloys, plastics, composites, or any other material known to those of ordinary skill in the art.

Figure 10:
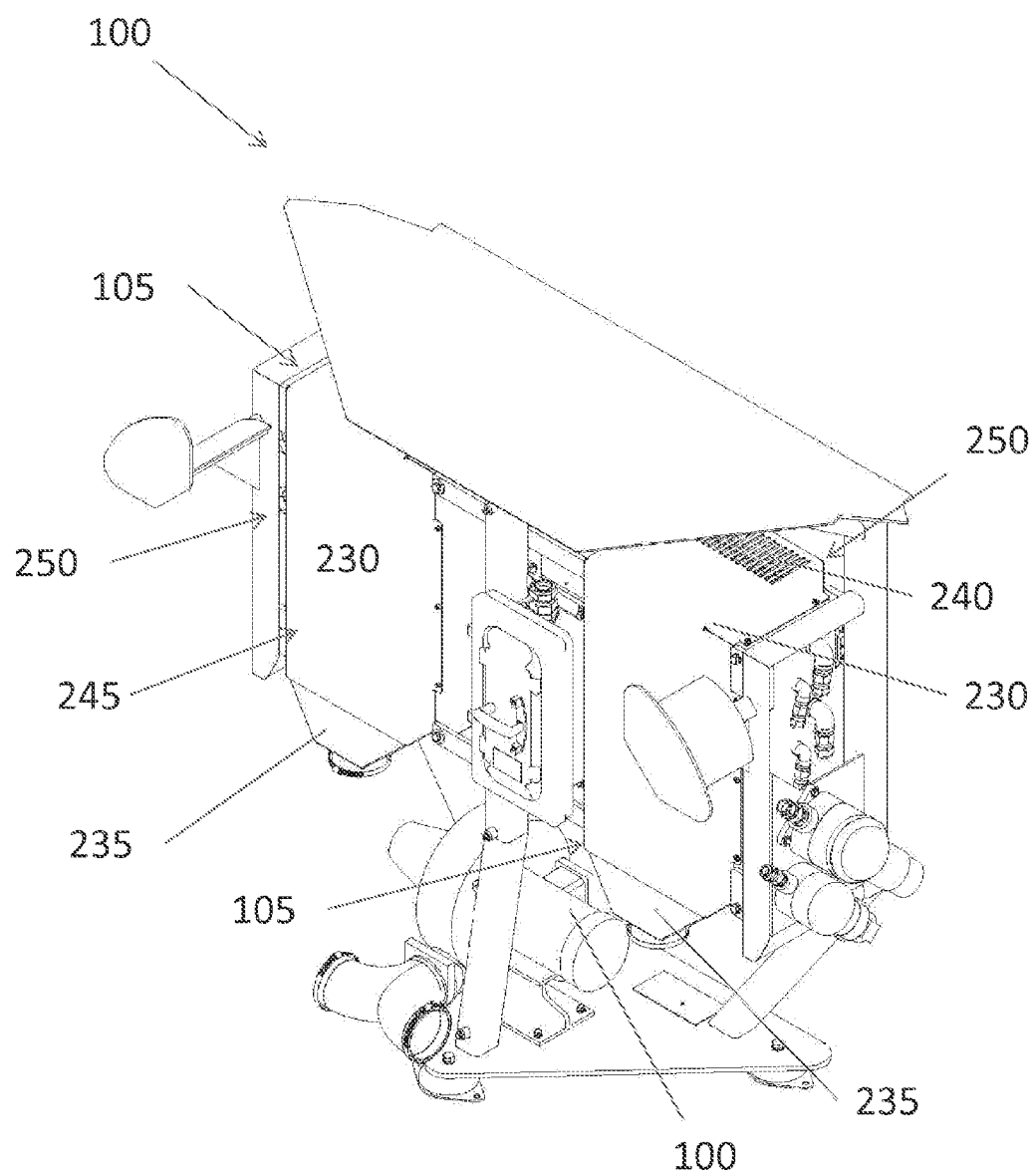
FIG. 10 shows a back perspective view of an explosion resistant enclosure according to embodiments of the present disclosure.

Referring brief to FIG. 10, a back perspective view of an explosion resistant enclosure, according to embodiments of the present invention is shown. In this embodiment, an explosion resistant enclosure 100 having two explosion resistant housings 105 is shown. Each explosion resistant housing 105 has an air shroud 230 disposed around it, thereby providing an air direction path. Air is provided from blower 215 through tubing (not shown) into lower section 235 of air shroud 230. The air is then directed upwardly over fins (not shown) of one or more heat exchangers (not shown). As the air contacts the fins of heat exchangers, the heat exchangers are cooled, thereby facilitating heat dissipation from explosion resistant housing 105. In order to prevent air in air shroud 230 from becoming too hot to be effective, air shroud 230 includes an air exit portion 240 located on the top of air shroud 230. Thus, after air circulates over the heat exchangers, the air exits through air exit portion 240. Those of ordinary skill in the art will appreciate that in alternate embodiments, one or more air exit portions may be located in other areas of air shroud 230, such as, for example, on the front wall 245, side walls 250, etc.

Referring back to FIG. 9, in still another embodiment, rather than use an external air circulation device 210, explosion resistant enclosure 100 may include an active fluid cooling system. In such an embodiment, rather than circulate air over heat exchangers 165 and/or 175 (FIG. 1), a fluid would be passed into contact with heat exchangers 165 and/or 175 (FIG. 1) in order to remove heat from the heat exchangers 165 and/or 175 (FIG. 1). Examples of fluids that may be used with an active fluid cooling system include water, air, water, hydrogen, inert gases, carbon dioxide, sulfur hexafluoride, ethylene glycol, diethylene glycol, propylene glycol, heavy water, polyalkylene glycol, mineral oil, silicone oil, fluorocarbon oil, freons, anhydrous ammonia, liquid nitrogen, and other refrigerants. The above list of fluids that may be used with active fluid cooling system is not exhaustive and is only meant as exemplary as to the types of coolants that may be used in active fluid cooling systems.

In embodiments using an active fluid cooling system, the coolant may be pumped through pipes into contact with heat exchangers 165 and/or 175 (FIG. 1). Alternatively, coolant may be piped into contact with explosion resistant housing 105. Generally, coolant is not piped into direct contact with explosion resistant housing 105, rather, pipes with coolant flowing therethrough contact either explosion resistant housing 105, heat exchangers 165 and/or 175 (FIG. 1) or both.

Methods of thermal management of explosion resistant enclosures may facilitate longer use of circuit components in hazardous environments. In one embodiment, a method of thermal management within an enclosure includes transferring heat from a transistor within an explosion resistant housing. In such an embodiment, the heat is transferred from the transistor to a plate disposed on a back wall of the explosion resistant housing. The method further includes passively removing the heat from the explosion resistant housing by passing the heat through a passive heat exchanger mounted on the outside of the back wall of the explosion resistant housing.

In other embodiments, the method may further include circulating air within the explosion resistant housing. As explained above, circulating air within the explosion resistant housing may include using one or more fans disposed within the explosion resistant housing. The air may be pulled away from heat generating circuit components or maybe blown over heat generating circuit components to facilitate heat removal therefrom.

In other embodiments, the method may further include circulating air over a passive heat exchanger. Air circulation over the passive heat exchanger may include blowing air directly over the heat exchanger or may include directing air proximate an air redirection sheath, which then redirects the air over the heat exchanger and/or the explosion resistant housing. In certain embodiments, air may be circulated over more than one heat exchangers. For example, air may be circulated over a heat exchanger disposed on the back wall of the explosion resistant housing and or over a second heat exchanger disposed on the top of the explosion resistant housing.

In still other embodiments, the method may further include transferring heat from a rectifier disposed within the explosion resistant housing. In this method, heat is transferred from the rectifier to the plate, which is disposed on the back wall of the explosion resistant housing.

In certain embodiments, the explosion resistant housing and/or the plate may include aluminum or an aluminum alloy. The thermal conductivity of the alloy used may be between 27 W/mK and 50 W/mK at 68° F., between 50 W/mK and 75 W/mK at 68° F., between 75 W/mK and 100 W/mK at 68° F., and between 100 W/mK and 118 W/mK at 68° F. In still other embodiments, the thermal conductivity of the alloy used may be between 27 W/mK and 118 W/mK at 68° F. Those of ordinary skill in the art will appreciate that while aluminum alloy has been described as a metal that is used according to embodiments described herein, in other embodiments, other metals and metal alloys may be used. In such embodiments, the metals and metal alloys used may have a thermal conductivity of greater than 26 W/mK at 68° F. Accordingly, the thermal conductivity of the metal and/or metal alloys used may be any value greater than 26 W/mK at 68° F., such as between 27 W/mK and 118 W/mK at 68° F., or greater than 118 W/mK at 68° F. In certain embodiments, an alloy of aluminum and steel may be used. In such an embodiment, the thermal conductivity of the alloy may be less than 26 W/mK at 68° F. For example, in certain embodiments, an aluminum steel alloy, or another steel alloy may have a thermal conductivity between 20 W/mK and 26 W/mK at 68° F. In addition to the explosion resistant housing and/or the plate on which the transistors and/or rectifiers may be disposed, other plates may be disposed within the explosion resistant housing that may or may not have circuit components disposed thereon. Such addition plates may be used to facilitate the removal of heat from circuit components or shield circuit components from heat generated by other circuit components.

In an alternate method of thermal management within an enclosure rather than, or in addition to passive thermal management, an active thermal management method may be used. In such a method, heat is transferred from a transistor within an explosion resistant housing. In such an embodiment, the heat is transferred from the transistor disposed on a back wall of the explosion resistant housing. The method further includes actively removing the heat from the explosion resistant housing. Removing the heat includes passing the heat through a fluid cooling system disposed on the outside of the back wall of the explosion resistant housing.

In such an active cooling system, the explosion resistant housing and/or the plate may include aluminum or an aluminum alloy. The thermal conductivity of the alloy used may be between 27 W/mK and 50 W/mK at 68° F., between 50 W/mK and 75 W/mK at 68° F., between 75 W/mK and 100 W/mK at 68° F., and between 100 W/mK and 118 W/mK at 68° F. In still other embodiments, the thermal conductivity of the alloy used may be between 27 W/mK and 118 W/mK at 68° F. Those of ordinary skill in the art will appreciate that while aluminum alloy has been described as a metal that is used according to embodiments described herein, in other embodiments, other metals and metal alloys may be used. In such embodiments, the metals and metal alloys used may have a thermal conductivity of greater than 26 W/mK at 68° F. Accordingly, the thermal conductivity of the metal and/or metal alloys used may be any value greater than 26 W/mK at 68° F., such as between 27 W/mK and 118 W/mK at 68° F., or greater than 118 W/mK at 68° F. In certain embodiments, an alloy of aluminum and steel may be used. In such an embodiment, the thermal conductivity of the alloy may be less than 26 W/mK at 68° F. For example, in certain embodiments, an aluminum steel alloy, or another steel alloy may have a thermal conductivity between 20 W/mK and 26 W/mK at 68° F. In addition to the explosion resistant housing and/or the plate on which the transistors and/or rectifiers may be disposed, other plates may be disposed within the explosion resistant housing that may or may not have circuit components disposed thereon. Such addition plates may be used to facilitate the removal of heat from circuit components or shield circuit components from heat generated by other circuit components.

In other embodiments using an active cooling system, the method may further include circulating air within the explosion resistant housing. As explained above, circulating air within the explosion resistant housing may include using one or more fans disposed within the explosion resistant housing. The air may be pulled away from heat generating circuit components or maybe blown over heat generating circuit components to facilitate heat removal therefrom.

In still other embodiments using an active cooling system, the method may further include transferring heat from a rectifier disposed within the explosion resistant housing. In this method, heat is transferred from the rectifier to the back wall of the explosion resistant housing.

In embodiments using an active cooling system, a fluid coolant may be passed over or around a heat exchanger, the explosion resistant housing, and/or other components of the explosion resistant enclosure. In certain embodiments, piping may be used to flow fluids over or around the heat exchanger, the explosion resistant housing, and/or other components of the explosion resistant enclosure. Examples of fluids that may be used with an active liquid cooling system include water, air, hydrogen, inert gases, carbon dioxide, sulfur hexafluoride, ethylene glycol, diethylene glycol, propylene glycol, heavy water, polyalkylene glycol, mineral oil, silicone oil, fluorocarbon oil, freons, anhydrous ammonia, liquid nitrogen, and other refrigerants. The above list of fluids that may be used with an active fluid cooling system is not exhaustive and is only meant as exemplary as to the types of coolants that may be used in active fluid cooling systems.

Those of ordinary skill in the art will appreciate that other methods of managing heat within explosion resistant enclosure may be practiced by those of ordinary skill in the art in view of the present disclosure. Such additional methods are thus within the scope of the present disclosure.

Advantages of one or more embodiments of the present invention may include one or more of the following:

In one or more embodiments of the present invention, the apparatus disclosed herein may provide enhanced thermal regulation inside enclosure.

In one or more embodiments of the present invention, the apparatus disclosed herein may provide enhanced thermal regulation inside an explosion resistant or explosion proof enclosure.

In one or more embodiments of the present invention, the apparatus disclosed herein may provide passive heat exchange to allow for enhanced thermal regulation inside an explosion resistant or explosion proof enclosure.

In one or more embodiments of the present invention, one or more heat exchangers may be used to provide enhanced thermal regulation inside an explosion resistant or explosion proof enclosure.

In one or more embodiments of the present invention, external air circulation devices may be used to provide enhanced thermal regulation inside an explosion resistant or explosion proof enclosure.

In one or more embodiments of the present invention, internal air circulation devices may be used to provide enhanced thermal regulation inside an explosion resistant or explosion proof enclosure.

In one or more embodiments of the present invention, active fluid cooling systems may be used to may be used to provide enhanced thermal regulation inside an explosion resistant or explosion proof enclosure.

In one or more embodiments of the present invention, explosion resistant or explosion proof housings, as well as plates disposed therein may be used to provide enhanced thermal regulation inside an explosion resistant or explosion proof enclosure.

In one or more embodiments of the present invention, explosion resistant or explosion proof housings, as well as plates disposed therein may be formed from metal or metal alloys, such as aluminum, may be used to provide enhanced thermal regulation inside an explosion resistant or explosion proof enclosure.

In one or more embodiments of the present invention, heat generating circuit components, such as transistors and/or rectifiers may be placed on a back wall or a plate attached to a back wall of an explosion resistant or explosion proof housing to provide enhanced thermal regulation inside an explosion resistant or explosion proof enclosure.

In one or more embodiments of the present invention, heat may be removed from an explosion resistant or explosion proof housing through active or passive cooling systems.

In one or more embodiments of the present invention, by removing heat from an explosion resistant or explosion proof enclosure, the circuit components disposed therein may last longer during operation.

In one or more embodiments of the present invention, removing heat from an explosion resistant or explosion proof enclosure may provide for better "up time" during operation of electronics at a work site.

In one or more embodiments of the present invention, removing heat from an explosion resistant or explosion proof enclosure may result in increased safety at a work site.

In one or more embodiments of the present invention, removing heat from an explosion resistant or explosion proof may result in a more profitable and/or more efficient work site.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. An enclosure comprising:
    an explosion resistant housing having a back wall, a top, a first side, a second side, and a door;
    a transistor disposed on the back wall;
    a passive heat exchanger disposed on the outside of the back wall of the explosion resistant housing;
    an air circulation device disposed outside the explosion resistant housing and configured to move air over at least the passive heat exchanger; and
    an air shroud disposed over the explosion resistant housing,
    wherein at least a portion of the transistor is disposed on a plate and at least a portion of the transistor is disposed on the back wall.

2. The enclosure of claim 1, further comprising a second heat exchanger disposed on the top of the explosion resistant housing.

3. The enclosure of claim 1, further comprising at least one air circulation device disposed inside the explosion resistant housing.

4. The enclosure of claim 1, further comprising an active fluid cooling system disposed on the outer back wall of the explosion resistant housing.

5. The enclosure of claim 1, wherein at least the first side, the second side, and the back of the enclosure comprises aluminum.

6. The enclosure of claim 1, wherein a plurality of circuit components are disposed on a second plate, wherein the second plate comprises aluminum and the second plate is disposed in explosion resistant housing.

7. The enclosure of claim 1, wherein a rectifier is disposed on the back wall of the explosion resistant housing.

8. A method of thermal management within an enclosure, the method comprising:
    transferring heat from a transistor within an explosion resistant housing, wherein the heat is transferred from the transistor to a back wall of the explosion resistant housing;
    removing passively the heat from the explosion resistant housing;
    moving air over a passive heat exchanger disposed on a back wall of the explosion resistant housing, wherein the air is directed through an air shroud; and
    removing actively the heat from the explosion resistant housing, wherein the removing includes passing the heat through a fluid cooling system disposed outside of the explosion resistant housing.

9. The method of claim 8, further comprising circulating air within the explosion resistant housing.

10. The method of claim 8, further comprising transferring heat from a rectifier disposed on the back wall of the explosion resistant housing.

11. The method of claim 8, wherein the explosion resistant housing comprises aluminum.

12. An explosion resistant enclosure comprising:
an explosion resistant housing having a back wall, a top, a first side, a second side, and a door;
a variable frequency drive disposed in the explosion resistant housing, the variable frequency drive comprising at least an insulated-gate bipolar transistor and a rectifier, wherein at least one of the insulated-gate bipolar transistor and the rectifier is disposed on the back wall of the explosion resistant housing;
a passive heat exchanger disposed on the outside of the back wall of the explosion resistant housing;
an air circulation device disposed outside the explosion resistant housing and configured to move air over at least the passive heat exchanger;
an air shroud disposed over the explosion resistant housing; and
a radiant barrier disposed above the explosion resistant enclosure.

13. The explosion resistant enclosure of claim 12, wherein the explosion resistant housing comprises aluminum.

14. The explosion resistant enclosure of claim 12, wherein heat is transferred from a rectifier within the explosion resistant housing, wherein the heat circuit components are disposed on a plate, and wherein the plate is disposed in the explosion resistant housing.

15. The explosion resistant enclosure of claim 1, further comprising an active fluid cooling system.

16. The explosion resistant housing of claim 15, wherein the active fluid cooling system comprises one or more pipes containing fluids disposed proximate the passive heat exchanger.

* * * * *